United States Patent [19]

Sigg et al.

[11] 4,141,022
[45] Feb. 20, 1979

[54] REFRACTORY METAL CONTACTS FOR IGFETS

[75] Inventors: Hans J. Sigg, Sunnyvale; Ching W. S. Lai, San Jose; Warren C. Rosvold, Sunnyvale, all of Calif.

[73] Assignee: Signetics Corporation, Sunnyvale, Calif.

[21] Appl. No.: 832,683

[22] Filed: Sep. 12, 1977

[51] Int. Cl.² .............................................. H01L 29/72
[52] U.S. Cl. ........................................ 357/23; 357/67; 357/68; 357/71
[58] Field of Search ........................ 357/67, 68, 71, 23

[56] References Cited
U.S. PATENT DOCUMENTS
3,906,540  9/1975  Hollins ................................. 357/67

Primary Examiner—Edward J. Wojciechowicz
Attorney, Agent, or Firm—Jerry A. Dinardo; Jack Oisher

[57] ABSTRACT

A metal contact system for an IGFET having shallow source and drain includes a refractory metal silicide layer forming low resistance ohmic contact to a silicon surface, a layer on the silicide layer of another refractory metal to serve as a barrier against diffusion of the interconnect metal, and a layer of interconnect metal over the diffusion barrier layer. The refractory metal layers are deposited by sputtering platinum or platinel for the first layer and titanium-tungsten for the second layer. In metal gate construction an additional layer of chromium is used as an etch resistant mask to protect the refractory metal layers from chemical attack when removing silicon nitride after it has been used initially as an oxidation mask and later as a sputtering mask.

13 Claims, 21 Drawing Figures

REFRACTORY METAL CONTACTS FOR IGFETS

BACKGROUND OF THE INVENTION

This invention relates to insulated gate field effect transistors and particularly to improved means for making ohmic contacts of good integrity to silicon surface regions thereof.

In conventional insulated gate field effect transistors, commonly known by the acronym IGFET, the source and drain electrodes usually comprise a low melting point metal such as aluminum, which has been deposited on the surface of the source and drain regions making ohmic contact therewith. While aluminum may be satisfactory for this purpose in such devices that have relatively deep source and drain regions, that is, depths greatly exceeding 1 micron, it has not proven to be satisfactory for making ohmic contact to source and drain regions which are rather shallow, such as 1 micron or less in depth. A serious problem encountered with aluminum or other low melting point metal is that concerning the strong tendency for the metal to diffuse through the shallow depth of the semiconductor regions and thereby cause the underlying semiconductor junction to be short circuited. Also, in IGFETS employing a polysilicon gate it is not always a routine matter to make ohmic contact to the polysilicon gate which is of good integrity in the first instance and which retains it thereafter.

SUMMARY OF THE INVENTION

According to one aspect of the invention, advantage is taken of the ability of an oxidation masking member that is already present for a prior masking function to perform a different masking function during a subsequent metal sputtering operation. It has been found, for example, that silicon nitride which is used in the manufacture of a metal gate MOS to provide a barrier to the growth of additional oxide on the preformed gate oxide, which is the silicon oxide overlying the channel between the source and drain regions, can serve as an effective sputter processing mask for the same gate oxide during sputter etching processing steps as well as during sputter depositions of an ohmic contact-forming metal system that includes refractory metals.

One of the refractory metals, such as platinum, forms a silicide alloy with the silicon surface on which it is deposited. The silicide is formed on the single crystal silicon surface of the source and drain regions. The refractory metal alloys with the silicon surface to form very effective ohmic contact of good integrity.

A second refractory metal layer, such as an alloy of titanium and tungsten, is sputter deposited on the refractory metal silicide. The second refractory metal layer serves as a barrier to prevent the diffusion through the source and drain regions of atoms of the subsequently deposited interconnect metal, such as aluminum alone or chromium followed by aluminum. The second refractory metal layer also serves as a bonding agent for the interconnect metal, which does not readily adhere to the silicide.

In the process of fabricating an IGFET of the metal gate construction, it has been found advantageous to provide an etch resistant metal layer, such as chromium, over the refractory metal layers to protect them from being etched by the chemical etchant that is used to remove the silicon nitride sputter process mask. In this form of construction it is found preferable to eliminate the unnecessary additional step of removing the chromium, and so it remains as an underlayer for the aluminum interconnect metal.

The refractory metal ohmic contact-forming system is also found useful in the construction of IGFETS of the polysilicon gate variety. While this form of construction does not employ a silicon nitride oxidation barrier layer, it does require a permanent polysilicon layer over the gate oxide. The presence of the polysilicon layer at the stage of the processing sequence of forming the metal contacts can also be used to mask the underlying gate oxide from sputtering damage. Additionally, the refractory metal contact system may also be applied to the polycrystalline silicon surface of the silicon gate to provide ohmic contacts of long lasting effectiveness.

DESCRIPTION OF THE PREFERRED EMBODIMENT

Figure 1:
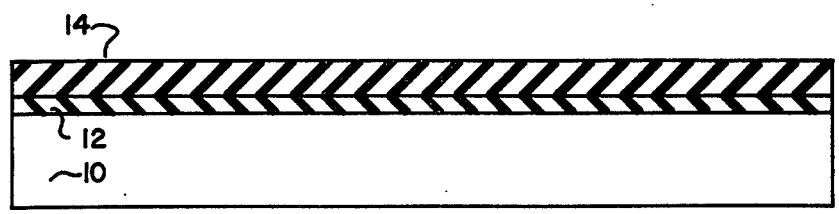
FIGS. 1 – 12 are diagrammatic views illustrating various stages of fabricating a MOS device constructed according to the invention.

With reference to the drawing a processing sequence will now be described for fabricating a metal gate MOS device according to the invention. The example described will be an N channel type MOS device although a P channel type can be fabricated by simply reversing the P and N regions. In FIG. 1, a P type semiconductor body portion 10 of monocrystalline silicon may be provided with an insulating layer 12 of uniform thickness on a major surface thereof. The P type silicon body portion 10 may have a <100> orientation with respect to the surface plane of the silicon semiconductor body portion 10. The P type impurity, such as boron, may have a concentration such as to produce a resistivity in the body portion 10 of 17–33 ohm-cm. The insulating layer 12 may comprise silicon dioxide and may be formed by growing a thermal oxide layer by simply heating the body portion 10 in an oxidizing atmosphere in a manner well known until a thickness of oxide is obtained which is 500–1000 angstroms thick.

A layer 14 of oxidation barrier material, such as silicon nitride, is next deposited on the insulating layer 12. The oxidation barrier layer 14 serves to protect the insulating oxide layer 12 against further growth of oxide during subsequent processing steps and also functions as an ion implantation or a diffusion mask during selective introduction of impurities into the silicon body portion 10. The oxidation barrier layer 14 is preferably deposited to a thickness of 1000 to 3000 angstroms by the reaction of silane and ammonia at about 800° to 1000° C.

Figure 2:
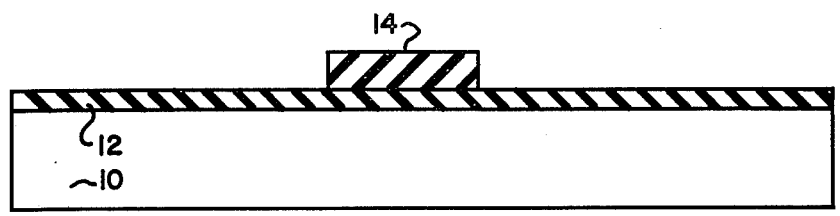

In the next step of the fabrication process shown in FIG. 2, the oxidation barrier layer 14 is patterned according to well known photolithographic processing techniques to define a rectangular or annular area which ultimately will become the gate area overlying the channel region.

Figure 3:
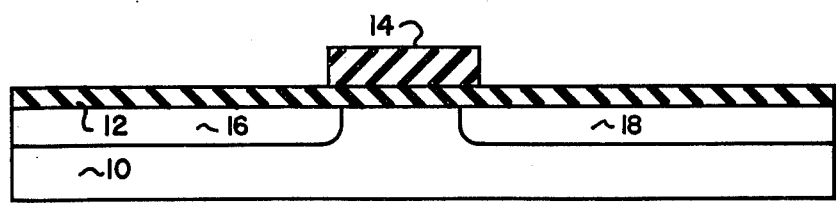

Following the gate definition step, a heavy concentration of an N type impurity is introduced into the semiconductor body portion 10 by ion implantation to form, as shown in FIG. 3, N+ low resistivity source and drain regions 16 and 18 respectively in the surface portions of the semiconductor body portion 10 that are not covered by the oxidation barrier layer 14. The source and drain regions 16 and 18 may also be formed by first removing the portions of the insulating layer 12 not covered by the oxidation barrier layer 14 and then diffusing the N type impurity into the silicon body portion 10. Thus, the oxidation barrier layer 14 may serve as a dopant mask to define the semiconductor regions selected for impurity doping either by ion implantation or by diffusion.

The surface portion of the semiconductor body portion 10 beneath the oxidation barrier layer 14 and between the source and drain regions 16 and 18 constitutes the channel of the MOS device. The source and drain regions 16 and 18 are very shallow and extend to a depth of about 1 micron or less. Source and drain regions of such shallow depth are required to reduce capacitance effects in UHF transistors.

Figure 4:
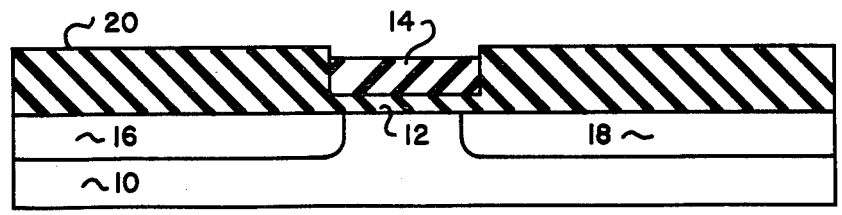

After the source and drain regions 16 and 18 have been formed, a thick oxide layer 20 is grown over the exposed surface regions of the silicon semiconductor body portion 10, as shown in FIG. 4. The thick oxide layer 20 is preferably at least as thick as or thicker than the combined thicknesses of the oxidation barrier layer 14 and the underlying gate oxide or insulating layer 12. Thus, the thick oxide layer 20 is grown to a thickness of about 3000 to 4000 angstroms. The thick oxide layer 20 is formed only in the regions of the semiconductor surface surrounding the oxidation barrier layer 14, and growth of the gate oxide or insulating layer 12 is prevented by the presence of the overlying oxidation barrier layer 14.

Figure 5:
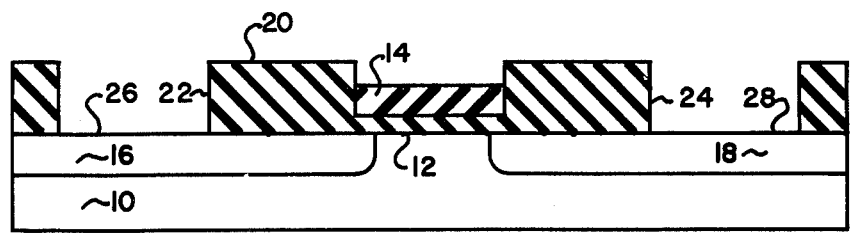

The next step in the processing is shown in FIG. 5 and comprises forming openings 22 and 24 in the thick oxide layer 20 to define contact areas 26 and 28 for the source and drain contacts respectively. The openings 22 and 24 may be formed in accordance with well-known photolithographic processing techniques. After the openings 22 and 24 are formed to define the contact areas 26 and 28, the device thus far fabricated is placed in a sputter deposition apparatus for depositing of the metal contacts for the source and drain. A suitable example of such apparatus is described in U.S. Pat. No. 3,855,623 issued to Warren C. Rosvold. As described in the Rosvold patent, the sputter deposition apparatus may be operated to sputter etch and remove a surface layer of the bare silicon from the contact areas 26 and 28 so that the etched areas 26 and 28 are free of oxide or other impurity deposits and are otherwise in clean condition to receive the metal to be deposited thereon in situ.

During the cleaning operation some of the thick oxide layer 20 and some of the oxidation barrier layer 14 is removed, but the gate oxide or insulating layer 12 is protected by the oxidation barrier layer 14 which now functions as a mask for the insulating layer 12 during the sputter etching operation as well as during subsequent sputter deposition of the contact metal.

Figure 6:
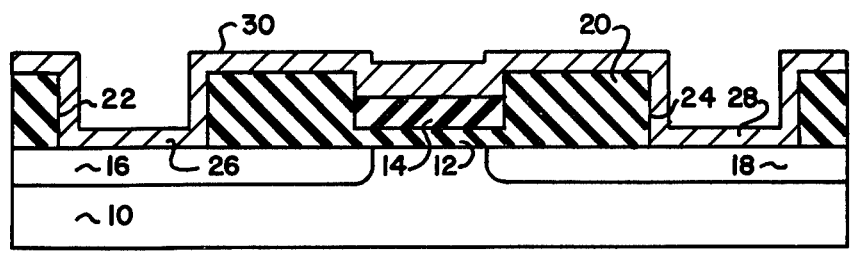

After the source and drain contact areas 26 and 28 have been cleaned, the sputtering apparatus is operated in its metal deposition mode to deposit a first metal layer 30 over the structure as shown in FIG. 6. The first metal layer 30 may be an alloy of platinum and nickel, called platinel and may be deposited according to the procedure disclosed in the above Rosvold patent. The metal layer 30 is deposited preferably to a thickness of about 500 angstroms, after which it is heated at about 450° C for about 2 minutes, although the temperature can be as low as 350° C and as high as 525° C. The heated platinel alloy reacts with the silicon in the contact areas 26 and 28 to form a ternary compound which can be identified as a platinel silicide alloy layer 32.

Platinum alone may be used for the first metal layer 30 instead of platinel, in which case the alloying temperature may be 500° C and the alloy layer 32 will be platinum silicide.

Figure 7:
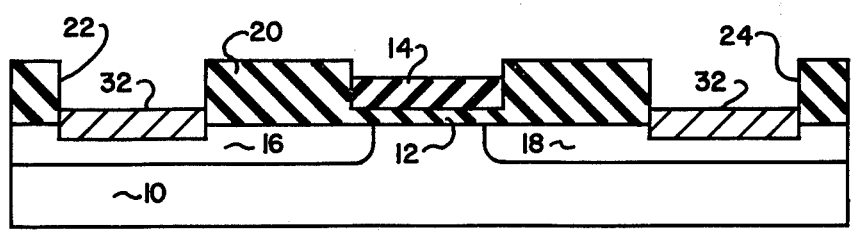

No reaction occurs in any areas other than the contact areas 26 and 28 where silicon is present, so that the unreacted portions of the metal layer 30 can be removed by selective etching, such as with an aqua regia solution, without affecting the silicide alloy layer 32 which is inert to the aqua regia solution. FIG. 7 shows the structure after the formation of the silicide alloy layer 32 and after stripping of the unreacted first metal layer 30.

It has been found that platinel silicide and platinum silicide form low resistance ohmic contact with the heavily doped N+ silicon source and drain regions 16 and 18. However, the silicide alloy layer 32 is ineffective by itself to prevent diffusion of the interconnecting metal, such as aluminum or gold, which may be deposited as a final metallization layer. The interconnecting metal would readily diffuse through the silicide alloy layer 32 and through the shallow source and drain regions 16 and 18 and short circuit the PN junctions that the regions 16 and 18 form with the body portion 10.

Figure 8:
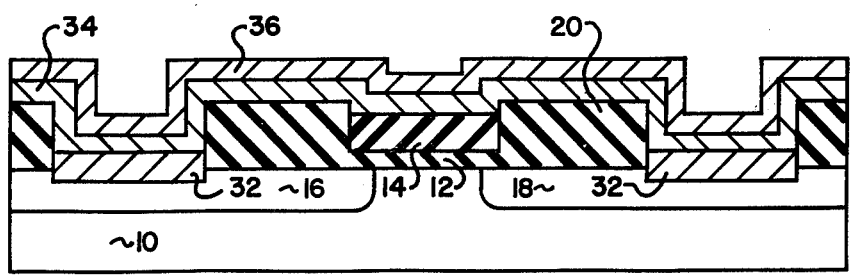

In accordance with another feature of the invention, a diffusion barrier layer 34 of a second refractory metal or metal combination is deposited on the silicide alloy layer 32. The diffusion barrier layer 34 may be deposited by sputtering titanium and tungsten to form an alloy of those two metals covering the structure shown in FIG. 8. The diffusion barrier layer 34 may have a thickness of about 1000 angstroms. The proportions of tungsten and titanium may vary from 40% atomic weight tungsten to 50% atomic weight tungsten and the balance titanium. The diffusion barrier layer 34 adheres strongly to the silicide alloy layer 32 and also to the metal which will be deposited thereon. Using conventional RF, DC or magnetron sputtering techniques in a partial pressure of an inert gas such as high purity argon, the titanium tungsten barrier metal is readily deposited from an alloy cathode. This is straightforward, well known thin film process technology.

In accordance with still another feature of the invention, a third metal layer, or metal masking layer 36, is sputter deposited over the diffusion barrier layer 34. The metal masking layer 36 is made of a suitable metal or combination of metals that is resistant to the chemical which will remove the oxidation barrier layer 14 during the next processing step prior to depositing the interconnect metal. It is found that chromium, which is relatively easy to sputter, is resistant to phosphoric acid used to remove the silicon nitride oxidation barrier layer 14 and will protect the refractory metal layers 30 and 32 from chemical attack by the phosphoric acid. The chromium metal masking layer 36 may be deposited in a manner similar to that described for titanium-tungsten and may have a thickness of about 2000 angstroms.

Figure 9:
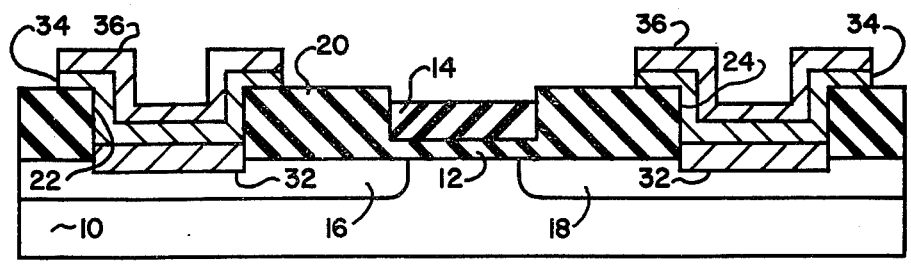

In the next series of processing steps the contacts for source and drain are defined and the metal layers 34 and 36 are selectively removed from all surface areas except those lying directly above and slightly overlapping the openings 22 and 24, as shown in FIG. 9. A chemical solution of potassium ferricyanide may be used to remove the chromium layer 36 and hydrogen peroxide may be used to remove the titanium-tungsten.

Figure 10:
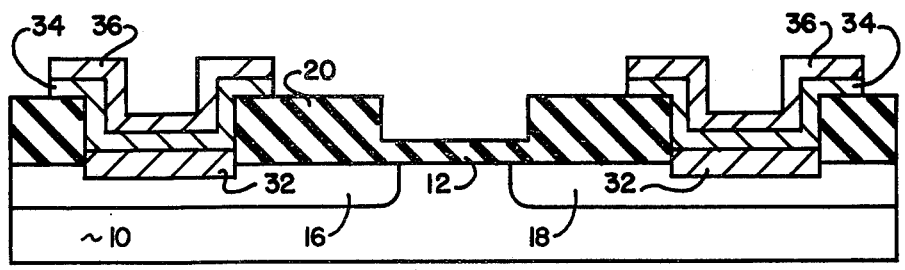

This series of processing steps defines the areas of the metal contacts for the source and drain and also exposes the oxidation barrier layer 14, which now can be removed, as with phosphoric acid in the case of silicon nitride. As shown in FIG. 10, the removal of the oxidation barrier layer 14 leaves the gate oxide insulating layer 12 in a depression surrounded by the thicker oxide layer 20 and thereby defines the gate area.

Figure 11:
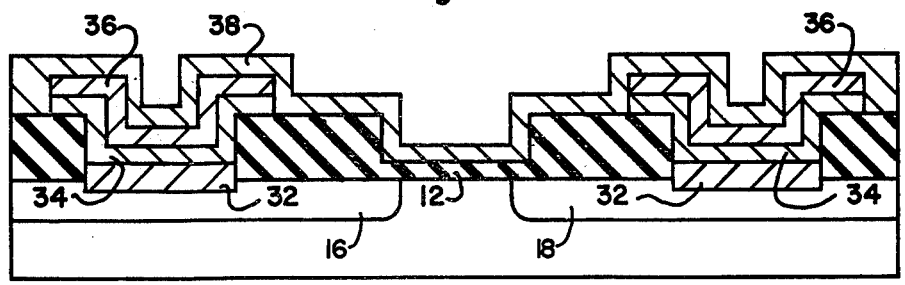

In the final series of processing steps a layer 38 of interconnect metal, such as aluminum or gold, having a relatively low melting point may be vacuum deposited over the structure, as shown in FIG. 11. The interconnect metal layer 38 is typically about 10,000 angstroms thick. The interconnect metal layer 38 is then patterned to form a contact 40 for the source, a contact 42 for the drain, and a contact 44 for the gate electrode as shown in FIG. 12.

Figure 12:
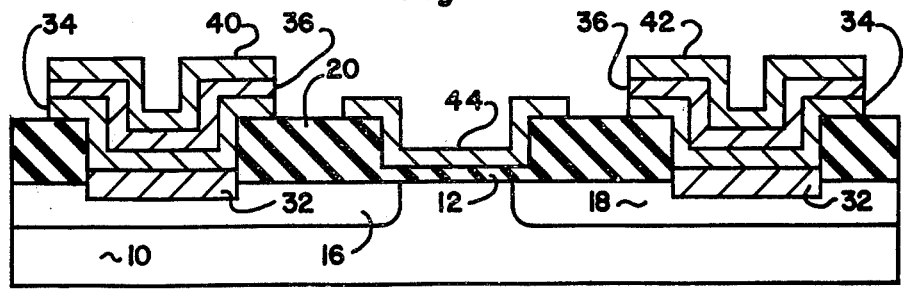

It will be noted in FIG. 12 that the metal contact system for the source and drain includes the ohmic contact-forming silicide alloy layer 32, the diffusion barrier layer 34 of titanium and tungsten, the metal masking layer 36 of chromium, and the interconnect metal layer 38 of aluminum. In metal gate construction of IGFET where the oxidation barrier layer 14 is employed during the fabrication process and later removed by a chemical etchant, it is necessary to protect the refractory metal layers 32 and 34 by chemical etch resistant means such as the metal masking layer 36. After the oxidation barrier layer 14 is removed it is unnecessary to retain the metal masking layer 36 and it can also be removed prior to depositing the interconnect metal layer 38. However, this would require an additional processing step, and therefore, it is preferable to leave the metal masking layer 36 intact and include it as part of the metal contact system.

In another form of IGFET construction utilizing a polysilicon gate electrode instead of a metal gate electrode, the polysilicon functions as an oxidation barrier to protect the gate oxide from further growth, and the silicon nitride as well as the chromium metal masking layer can be dispensed with. An embodiment of the invention will now be described which is useful in the construction of an IGFET having a polysilicon gate. In the processing steps depicted by FIGS. 13 – 24, a layer 46 of polycrystalline silicon is used in place of the silicon nitride for the oxidation barrier layer 14 previously described. As was the case with the silicon nitride layer, the polycrystalline silicon layer also functions as an ion implantation or diffusion mask, but unlike the silicon nitride it is conductive and therefore is retained as a permanent element of the gate structure.

Figure 13:
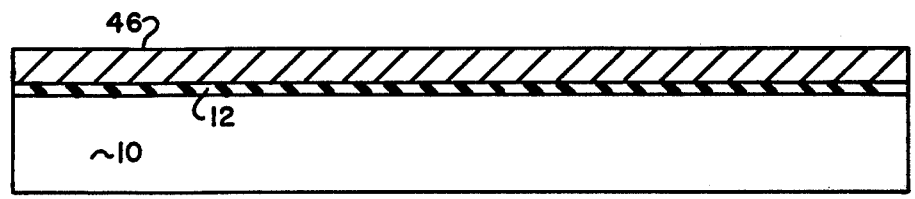
FIGS. 13 – 21 are diagrammatic views illustrating various stages of fabricating a polysilicon gate IGFET constructed according to the invention.
Figure 14:
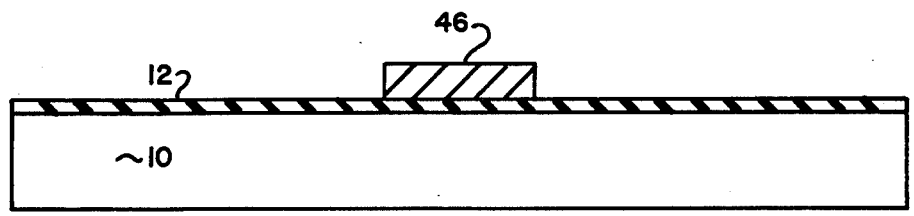

Referring now to FIG. 13, a layer 46 of polysilicon is deposited on the thermal oxide layer 12 formed on the surface of the body portion 10. The polysilicon layer 46 is 3000 – 6000 angstroms thick and may be deposited by low pressure chemical vapor deposition from silane. The polysilicon layer 46 is next patterned, as shown in FIG. 14, to define the gate area.

Figure 15:
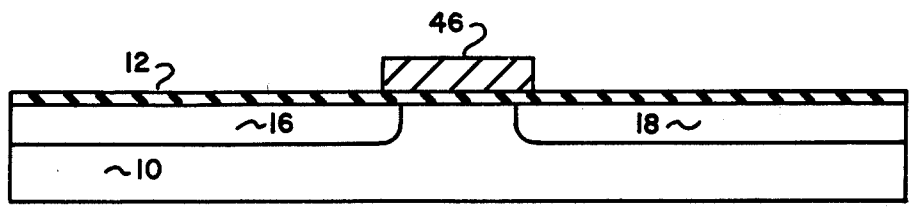

The source and drain regions 16 and 18 shown in FIG. 15 are then formed by ion implanting the appropriate N type impurity through the portions of the oxide insulating layer 12 uncovered by the polysilicon layer 46. Alternatively, the uncovered portions of the oxide insulating layer 12 may be removed and the N type impurity may then be diffused into the bare surface of the silicon body portion 10 to form the source and drain regions 16 and 18. The polysilicon layer 46 serves in the first case as an ion implantation mask and in the second case as a diffusion mask.

Figure 16:
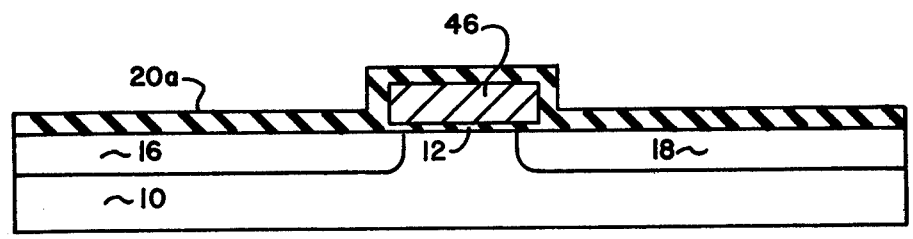
Figure 17:
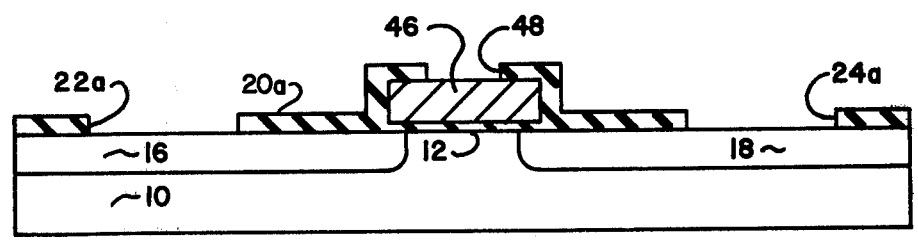

Next, as shown in FIG. 16, a thick oxide layer 20a is formed to cover both the surface of the silicon body portion 10 and the polysilicon layer 46. The oxide layer 20a may be 10,000 angstroms thick. Afterwards, openings 22a and 24a are formed in the thick oxide layer 20a over the source and drain regions 16 and 18 respectively, and an opening 48 is formed over the polysilicon layer 46, as shown in FIG. 17.

Figure 18:
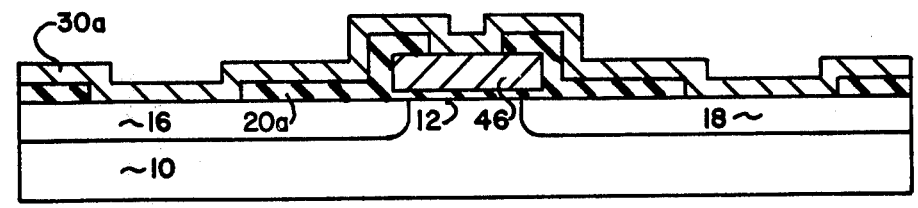
Figure 19:
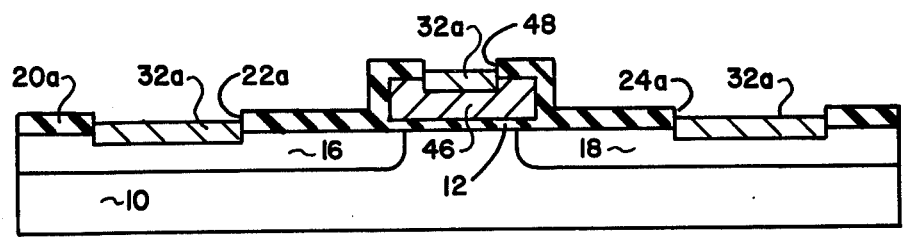

After sputter etching to clean the silicon surfaces, a first refractory metal layer 30a is sputter deposited over the structure shown in FIG. 18. Upon heating the structure the refractory metal reacts with the monocrystalline silicon present within the confines of the openings 22a and 24a over the source and drain regions 16 and 18 and with the polycrystalline silicon present within the confines of the opening 48 over the polysilicon gate 46. A refractory metal silicide alloy layer 32a is produced where the reaction occurs with the silicon, and the unreacted portions of the refractory metal layer 30a are removed, as shown in FIG. 19. The silicide layer 32a may be platinum silicide or platinel silicide, as in the previous embodiment.

Figure 20:
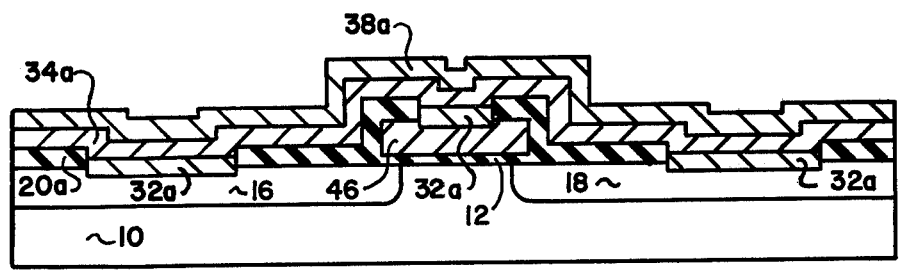
Figure 21:
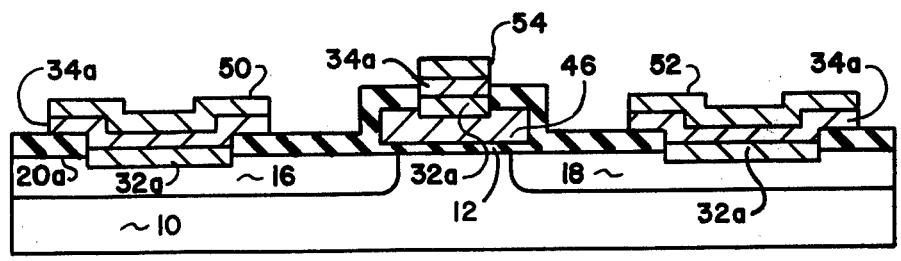

A diffusion barrier layer 34a of a second refractory metal, such as titanium and tungsten is then sputter deposited over the structure, as shown in FIG. 20, and the interconnect metal layer 38a of gold or aluminum is vacuum deposited on the diffusion barrier layer 34a. The metal layers 34a and 38a are patterned to form the source contact 50, the drain contact 52 and the polysilicon gate contact 54, as well as the interconnects.

In this embodiment, the refractory metal alloy layers 32a and 34a provide low resistance ohmic contact of good integrity to the polysilicon gate 46 as well as to the source and drain regions 16 and 18. Furthermore, since the polysilicon gate electrode 46, which functions as the oxidation mask and ion implantation or diffusion mask during processing, remains as a permanent part of the gate structure, the chromium etch mask is not required to protect the refractory metals from chemical attack and it is therefore omitted.

What is claimed is:
1. An insulated gate field effect transistor, comprising:
   (a) a silicon semiconductor body portion provided with spaced apart source and drain surface regions defining a channel region therebetween and having a gate electrode overlying said channel region and insulatingly spaced therefrom; and
   (b) means providing low resistance ohmic contact to each of said source and drain surface regions and including, superposed on said surface regions,
      (1) a layer of silicide of refractory metal sputter deposited on and in ohmic contact with said surface regions,
      (2) a layer of barrier metal sputter deposited on said metal silicide layer, and
      (3) a layer of interconnect metal of relatively low melting point as compared with both said metal silicide and said barrier metal overlying said barrier metal layer, said barrier metal layer serving to prevent diffusion of said interconnect metal and serving to facilitate bonding between said metal silicide and said interconnect metal.

2. The invention according to claim 1 wherein the refractory metal constituent of said silicide consists essentially of platinum.

3. The invention according to claim 1 wherein the refractory metal constituent of said silicide consists essentially of an alloy of platinum and nickel.

4. The invention according to claim 1 and further including a layer of chromium on said barrier metal, said gate electrode being constituted by a layer of said interconnect metal.

5. The invention according to claim 1, wherein said gate electrode is made of polysilicon and further wherein the means in (b) is also superposed on said polysilicon gate electrode forming low resistance ohmic contact therewith.

6. The invention according to claim 1, wherein said gate electrode is constituted by a layer of said interconnect metal spaced from said channel region by a layer of silicon dioxide.

7. A method of fabricating an IGFET, comprising:
 (a) providing source and drain regions separated from each other by a channel region adjacent to a surface of a silicon semiconductor body portion;
 (b) providing over said channel region a layer of silicon dioxide and a layer thereover of oxidation barrier material serving to protect said oxide layer from oxidation and from damage in a metal sputtering environment;
 (c) sputter depositing refractory metal on at least a portion of each of said source and drain regions and forming an alloy of said refractory metal with the surface regions of the silicon where deposited and ohmic contact with the silicon;
 (d) sputter depositing on said refractory metal alloy a layer of diffusion barrier metal capable of impeding diffusion of interconnect metal therethrough; and
 (e) depositing over said diffusion barrier metal layer a layer of interconnect metal of relatively low melting point as compared with said refractory metal and said diffusion barrier metal.

8. The invention according to claim 7 wherein said oxidation barrier material of step b) consists essentially of silicon nitride.

9. The invention according to claim 8 and further including subsequent to step (d) and prior to step (e) the steps of depositing on said diffusion barrier metal a layer of etchant masking metal that resists etching by a chemical agent to be used for removing said oxidation barrier layer; and chemically removing said oxidation barrier layer while said layer of etchant masking metal protects said diffusion barrier metal layer and said refractory metal alloy from chemical attack.

10. The invention according to claim 9 wherein said etchant masking metal consists essentially of chromium.

11. The invention according to claim 7, wherein said oxidation barrier material of step (b) consists essentially of polysilicon.

12. The invention according to claim 11, and further including in step (c) sputter depositing said refractory metal on said polysilicon layer.

13. The invention according to claim 1 wherein said barrier layer is an alloy consisting essentially of 40% to 50% atomic weight of tungsten and the balance titanium.

* * * * *